United States Patent
Modi et al.

(10) Patent No.: US 11,960,351 B1
(45) Date of Patent: Apr. 16, 2024

(54) SYSTEM AND METHOD FOR POISON INFORMATION PROPAGATION IN A STORAGE DEVICE

(71) Applicant: Cadence Design Systems, Inc., San Jose, CA (US)

(72) Inventors: Dipakkumar Trikamlal Modi, Ahmedabad (IN); Bikram Banerjee, Bangalore (IN); Maddula Balakrishna Chaitanya, Andhra Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/897,334

(22) Filed: Aug. 29, 2022

(51) Int. Cl.
  *G06F 11/07* (2006.01)
  *G06F 11/00* (2006.01)
  *G06F 11/30* (2006.01)
  *H03M 13/00* (2006.01)
  *H03M 13/11* (2006.01)

(52) U.S. Cl.
  CPC ........ *G06F 11/0772* (2013.01); *G06F 11/004* (2013.01); *G06F 11/3068* (2013.01); *H03M 13/1131* (2013.01); *H03M 13/611* (2013.01)

(58) Field of Classification Search
  CPC .. G06F 11/004; G06F 11/073; G06F 11/0703; G06F 11/0772; G06F 11/2215; G06F 11/3068; G06F 11/3072; G06F 11/3065; H03M 13/1131; H03M 13/611
  See application file for complete search history.

(56) References Cited

U.S. PATENT DOCUMENTS

| | | | | |
|---|---|---|---|---|
| 5,953,351 A * | 9/1999 | Hicks | ............... | G06F 11/1024 714/763 |
| 6,163,857 A * | 12/2000 | Meaney | ............... | G06F 11/1064 714/6.32 |
| 8,181,100 B1 * | 5/2012 | Purdham | ............... | G11C 29/42 714/819 |
| 8,707,104 B1 * | 4/2014 | Jean | ............... | G06F 11/0793 714/6.24 |
| 8,775,906 B2 * | 7/2014 | Dodson | ............... | G06F 11/1064 714/766 |
| 2002/0138803 A1 * | 9/2002 | Holman | ............... | H03M 13/01 |
| 2004/0139374 A1 * | 7/2004 | Meaney | ............... | G06F 11/0724 714/48 |
| 2022/0374309 A1 * | 11/2022 | Kim | ............... | G06F 11/1048 |

\* cited by examiner

*Primary Examiner* — Steve N Nguyen
(74) *Attorney, Agent, or Firm* — Mark H. Whittenberger; Holland & Knight LLP (57) ABSTRACT

Systems and methods for propagating poison information are provided. Embodiments include receiving write data having a poison flag asserted indicating the data to be written to a memory device is erroneous. Embodiments further include converting the write data to a pre-fixed data pattern and generating a parity code, based upon, at least in part, the pre-fixed data pattern. Embodiments may also include injecting a correctable error into the write-data or parity code and writing the write data and parity code into the memory device. The correctable error injection may occur in the data or in the parity code and during the read the comparison may occur accordingly.

17 Claims, 7 Drawing Sheets

Write data path:

| # | From Host | Before Encoder | After Encoder – into the memory |
|---|---|---|---|
| 1 | WrAddr=32'h8302_3810<br>WrData=64'h0123_4567_89AB_CDEF<br>Poison=1'b0 | WrData=<br>64'h0123_4567_89AB_CDEF | WrData = 64'h0123_4567_89AB_CDEF<br>Parity = 8'h0100_1100 |
| 2 | WrAddr=32'h8302_3918<br>WrData=64'h0123_4567_89AB_CDEF<br>Poison=1'b0 | WrData=<br>64'h0123_4567_89AB_CDEF | WrData = 64'h0123_4567_89AB_CDEF<br>Parity = 8'h0100_1100<br>Memory fault occurred in memory and data got corrupted. Now data in the memory = 64'h0123_~~7~~567_89AB_CDEF |
| 3 | WrAddr=32'h8302_3918<br>WrData=64'h0123_4567_89AB_CDEF<br>Poison=1'b0 | WrData=<br>64'h0123_4567_89AB_CDEF | WrData = 64'h0123_4567_89AB_CDEF<br>Parity = 8'h0100_1100<br>Memory fault occurred in memory and data got corrupted. Now data in the memory = 64'h0123_~~7~~567_89AB_CDEF |
| 4 | WrAddr=32'h8302_3920<br>WrData=64'h0123_4567_89AB_CDEF<br>Poison=1'b1 | WrData=<br>64'hCADE_11CE_CADE_11CE | WrData= 64'h0123_4567_89AB_CDEF<br>Parity = 8'h0100_1100<br>Corrupted Parity= 8'h0100_11~~11~~<br>(inject 2bit error - uncorrectable) |
| 5 | WrAddr=32'h8302_3928<br>WrData=64'h0123_4567_89AB_CDEF<br>Poison=1'b1 | WrData=<br>64'hCADE_11CE_CADE_11CE<br>(overwritten wrData with known poison pattern) | WrData= 64'hCADE_11CE_CADE_11CE<br>Parity = 8'b1011_1100<br>Corrupted Parity= 8'b1011_11~~0~~<br>(inject 1bit error - correctable) |

Read data path:

| # | From Host | From memory - Before Decoder | After Decoder - To the host |
|---|---|---|---|
| 1 | RdAddr=32'h8302_3910 | RdData=64'h0123_4567_89AB_CDEF<br>Parity = 8'h0100_1100 | RdData = 64'h0123_4567_89AB_CDEF<br>Error = 1'b0<br>Poison = 1'b0 |
| 2 | RdAddr=32'h8302_3918 | RdData=64'h0123_7567_89AB_CDEF<br>Parity = 8'h0100_1100 | RdData = 64'h0123_7567_89AB_CDEF<br>Error = 1'b1<br>Poison = 1'b1 |
| 3 | RdAddr=32'h8302_3918 | RdData=64'h0123_7567_89AB_CDEF<br>Parity = 8'h0100_1100 | RdData = 64'h0123_7567_89AB_CDEF<br>Error = 1'b1<br>Poison = 1'b0 |
| 4 | RdAddr=32'h8302_3920 | RdData=64'h0123_4567_89AB_CDEF<br>Parity = 8'h0100_14_11<br>*(Uncorrectable error)* | RdData = 64'h0123_4567_89AB_CDEF<br>Error = 1'b1<br>Poison = 1'b1 |
| 5 | RdAddr=32'h8302_3928 | RdData = 64'hCADE_11CE_CADE_11CF<br>Parity = 8'b1011_110_1<br>*(Correctable error)* | WrData = 64'hCADE_11CE_CADE_11CE<br>Corrected parity = 8'b0100_1100<br>Error = 1'b1<br>Poison = 1'b1 *(not a memory fault)* |

SYSTEM AND METHOD FOR POISON INFORMATION PROPAGATION IN A STORAGE DEVICE

BACKGROUND

A memory controller is a digital circuit that manages the flow of data going to and from the computer's main memory. It may be a separate chip or integrated into another chip, such as being placed on the same die or as an integral part of a microprocessor. When a memory controller receives corrupted data it is important to invalidate the targeted memory location content so that reads to that memory location results in an appropriate response to the host.

SUMMARY

In one or more embodiments of the present disclosure, a computer-implemented method for propagating poison information is provided. The method may include receiving write data having a poison flag asserted indicating the data to be written to a memory device is erroneous. The method further include converting the write data to a pre-fixed data pattern and generating a parity code, based upon, at least in part, the pre-fixed data pattern. The method may also include injecting a correctable error into the write-data or parity code and writing the write data and parity code into the memory device.

One or more of the following features may be included. In some embodiments, the method may include attempting to read data from the memory device. Attempting to read data from the memory device may include comparing the read data and parity code with a new known data pattern and parity code. Attempting to read data from the memory device may include correcting the correctable error at a decoder. The method may include comparing an output of the decoder with the pre-fixed data pattern. The method may further include reporting an error as poison propagated based upon the comparing. The method may also include encrypting the pre-fixed data pattern to generate a cipher pattern.

In another embodiment of the present disclosure, a computer-implemented method for propagating poison information is provided. The method may include receiving write data having a poison flag asserted indicating the data to be written to a memory device is erroneous. The method may further include converting the write data to a data pattern and generating a parity code, based upon, at least in part, the data pattern. The method may also include injecting a correctable error into the write-data or parity code and writing the write data and parity code into the memory device. The method may further include attempting to read data from the memory device, wherein attempting to read data from the memory device includes comparing the read data and parity code with a new known data pattern and parity code.

One or more of the following features may be included. In some embodiments, attempting to read data from the memory device may include correcting the correctable error at a decoder. The method may further include comparing an output of the decoder with the data pattern. The method may also include reporting an error as poison propagated based upon the comparing. The method may further include encrypting the data pattern to generate a cipher pattern.

In yet another embodiment of the present disclosure a system is provided. The system may include a processor configured to transmit write data having a poison flag asserted indicating the data to be written to a memory device is erroneous. The processor may be further configured to convert the write data to a pre-fixed data pattern and to generate a parity code, based upon, at least in part, the pre-fixed data pattern. The processor may be further configured to inject a correctable error into the write-data or parity code and to write the write data and parity code into the memory device.

One or more of the following features may be included. In some embodiments, the processor may be configured to attempt to read data from the memory device. Attempting to read data from the memory device may include comparing the read data and parity code with a new known data pattern and parity code. Attempting to read data from the memory device may include correcting the correctable error at a decoder. The processor may be configured to compare an output of the decoder with the pre-fixed data pattern. The processor may be configured to report an error as poison propagated based upon the comparing. The processor may be configured to encrypt the pre-fixed data pattern to generate a cipher pattern. The decoder may be configured to correct one bit or multi-bit errors.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Embodiments of the present disclosure are directed towards a mechanism for poison information propagation, in storage devices where spare storage is not available. Embodiments included herein may be configured to differentiate between error due to a memory fault and error due to poisoned write data.

Various embodiments of the methods and systems will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-7.

Figure 1:
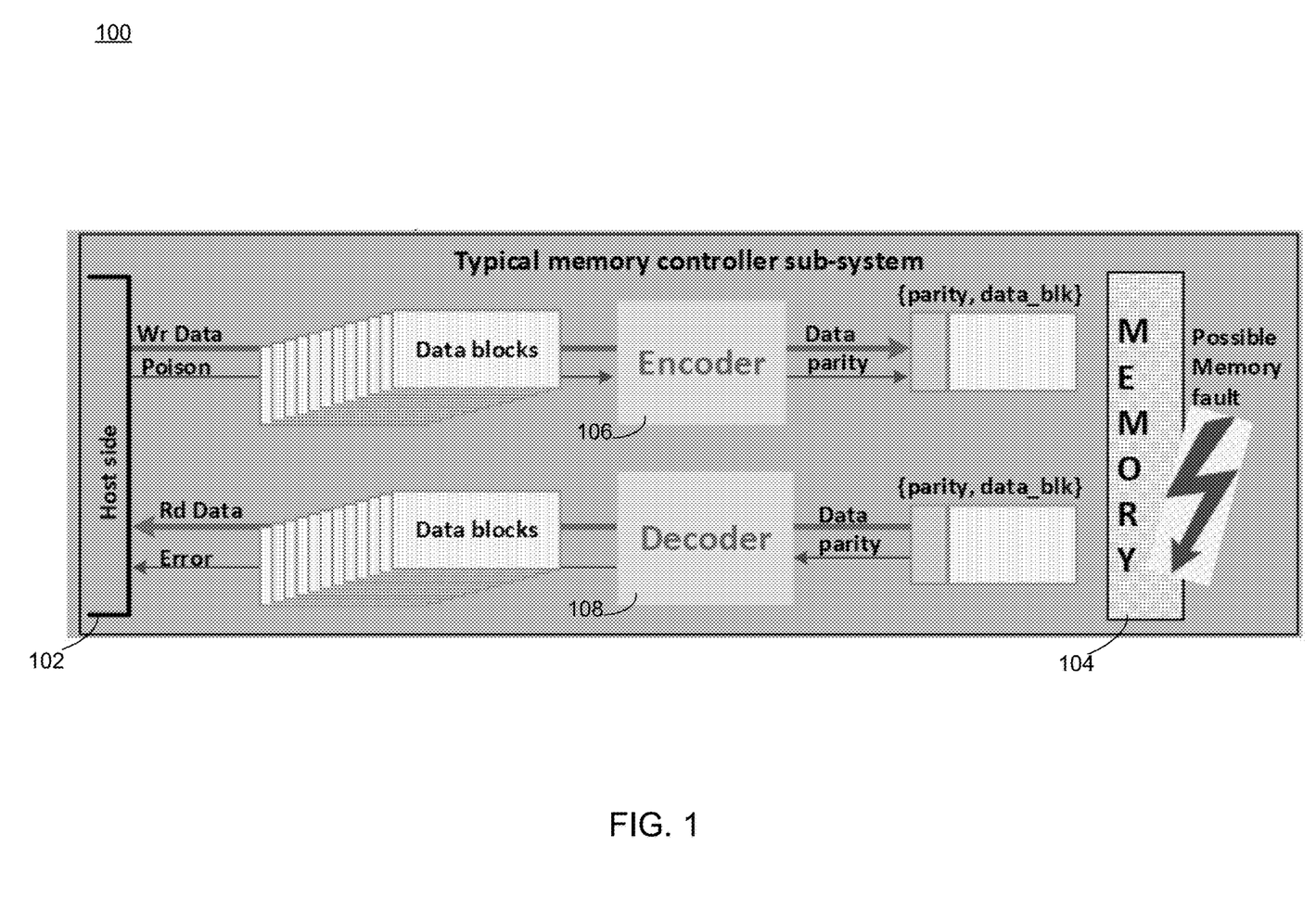
FIG. 1 illustrates a memory controller sub-system consistent with embodiments of the present disclosure.

Referring now to FIG. 1, an exemplary memory controller sub-system 100 is provided. Memory controller sub-system 100 may include one or more host devices 102, which may communicate with one or more memory devices 104. Write data may be transferred from host device 102 through encoder 106 to one or more memory devices 104. Read data may be transferred from one or more memory devices 104 through decoder 108 to host device 102. The write data path may include write-data and poison flag information as input. The asserted poison flag may indicate that write-data is erroneous. The read data path has read data and error flag. The asserted error flag may indicate that read data is erroneous. It should be noted that the source of error in the read path could be due to originally poisoned write data or due to some memory fault.

As discussed above, when a memory controller receives corrupted data, indicated by a poison flag or a sideband signal, it is important to invalidate the targeted memory location content so that read to that memory location results in an appropriate response to the host. In existing systems, determining how to invalidate the memory content is a difficult question. One option is to store an extra bit information indicating if the data was originally corrupted data during the write transaction. However, there may not be a spare bit in the memory for such extra information storage.

In some embodiments, the data block size and the parity code size may depend on type of codec being used. For example, a data block size of 64bits, a parity code size of 8bits and the error correcting codec may be capable of correcting a 1 bit error. In normal cases when the poison=0, write data and parity may be stored in the memory. During the read transfer, read data may be presented to the host along with error flag. If the decoder identifies uncorrectable error in the read data, it may report error=1 to the host along with read data.

Figure 2:
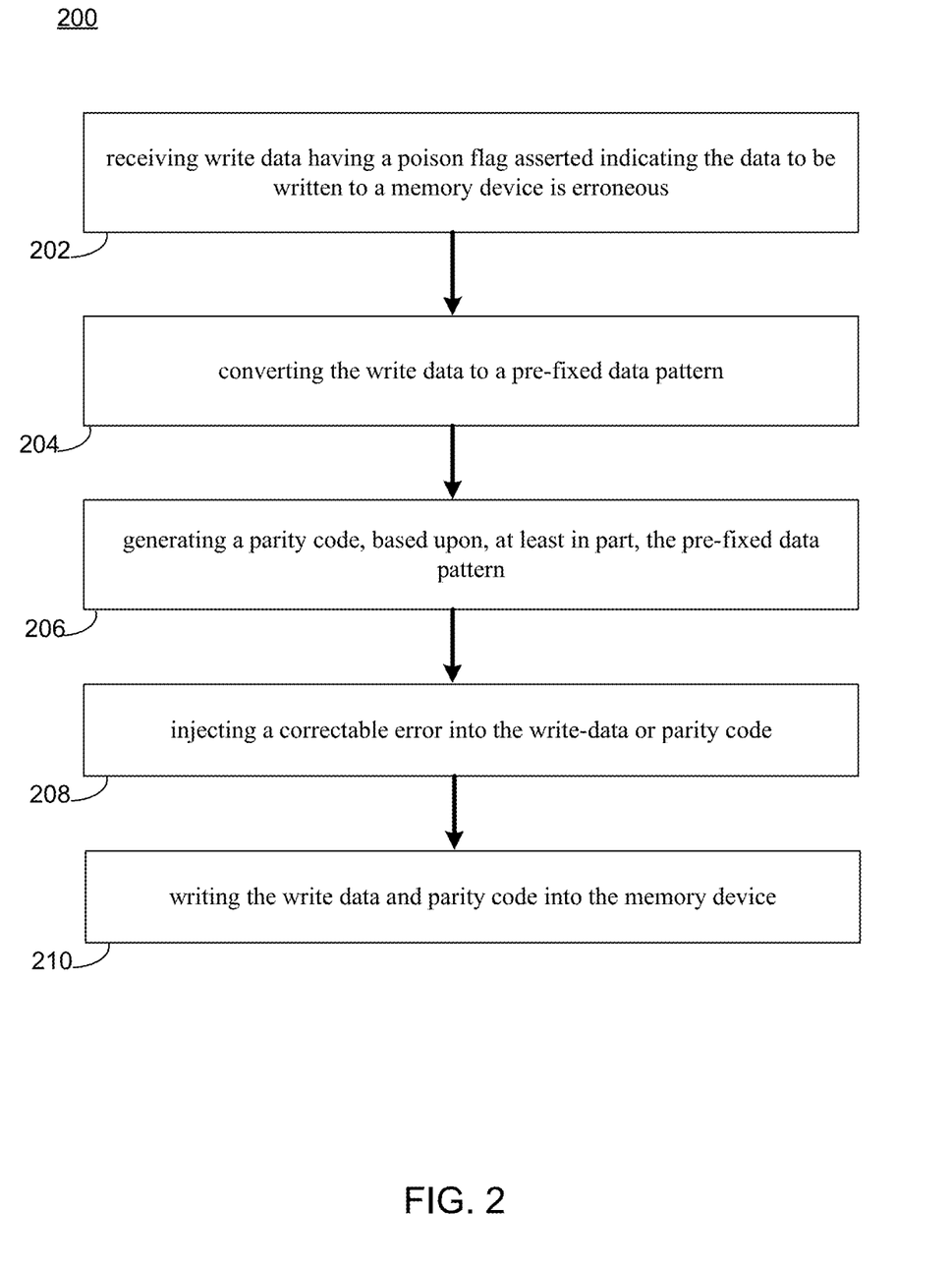
FIG. 2 illustrates a flowchart depicting operations consistent with embodiments of the present disclosure.

Referring now to FIG. 2, a flowchart depicting an embodiment for propagating poison information is provided. The method may include receiving (202) write data having a poison flag asserted indicating the data to be written to a memory device is erroneous. The method further include converting (204) the write data to a pre-fixed data pattern and generating (206) a parity code, based upon, at least in part, the pre-fixed data pattern. The method may also include injecting (208) a correctable error into the write-data or parity code and writing (210) the write data and parity code into the memory device. The correctable error injection may occur in the data or in the parity code and during the read the comparison may occur accordingly. Numerous other operations are also within the scope of the present disclosure as are discussed in further detail hereinbelow.

Figure 3:
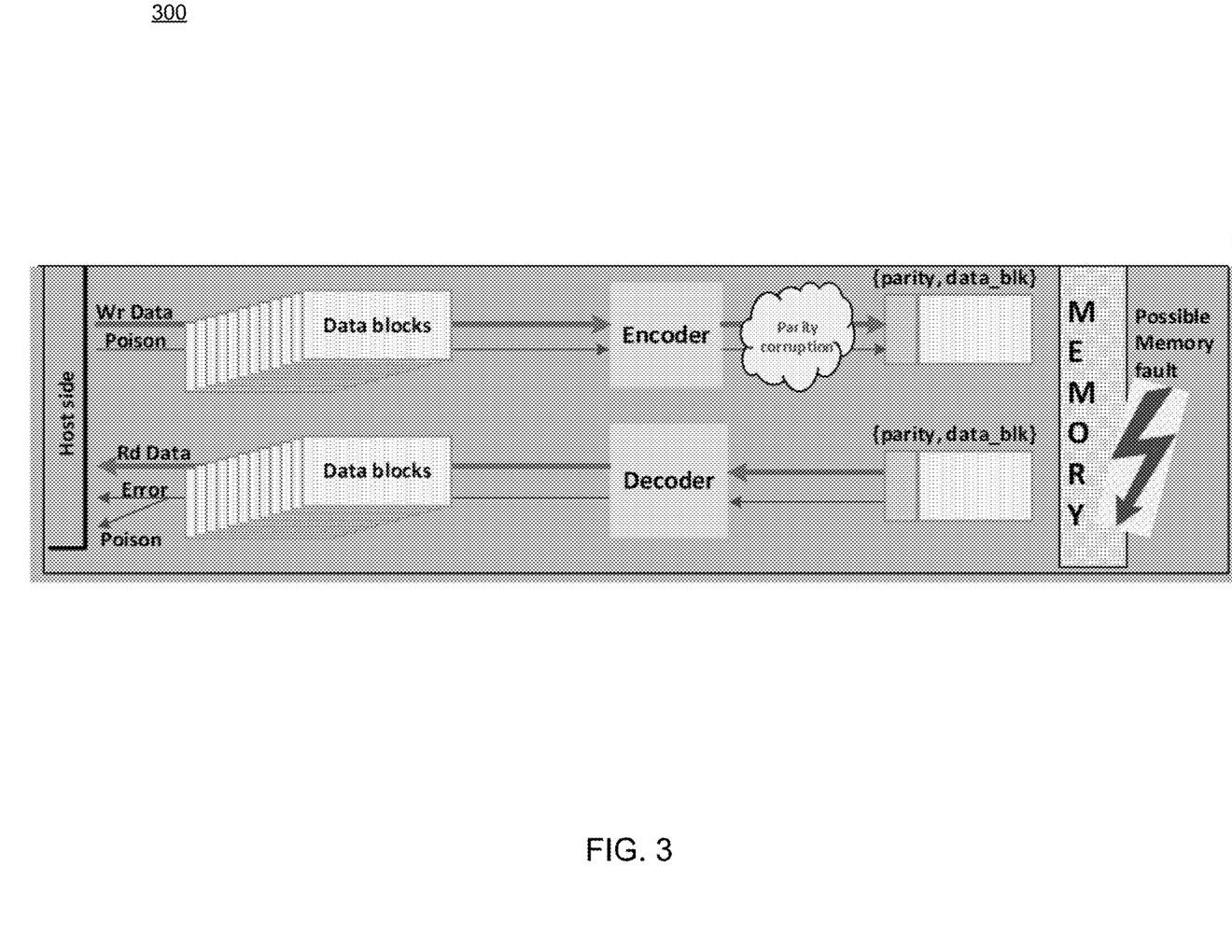
FIG. 3 illustrates a memory controller sub-system consistent with embodiments of the present disclosure.

Referring now to FIG. 3, a diagram showing a memory controller sub-system 300 with parity corruption is provided. In some cases, the problems identified above may exist in all storage components, including both volatile and non-volatile. However, to safely propagate poison information, only devices with error correcting code (ECC) support may be targeted. In such devices 'Data and ECC' is stored. ECC/parity codes may be used to detect and/or correct memory faults (e.g., soft errors/transient faults/permanent faults depending on the capability of codec used). In the particular example of FIG. 3, during a write transaction, the process may corrupt associated parity code (or call it ECC) for the poisoned write data. While reading that specific location, the host device may be configured to receive data that is flagged as erroneous data as the parity code fails to match the expected one. In this way, propagation of poison information from the write path to the read path may occur. In some existing systems, the detection of poisoned data during a read may be dependent on the parity mismatch due to the intentional corruption during write. However, that host may not be able to differentiate if the received erroneous data is due to poisoned write data (detected due to intentional parity corruption) or an actual fault in the memory.

Figure 4:
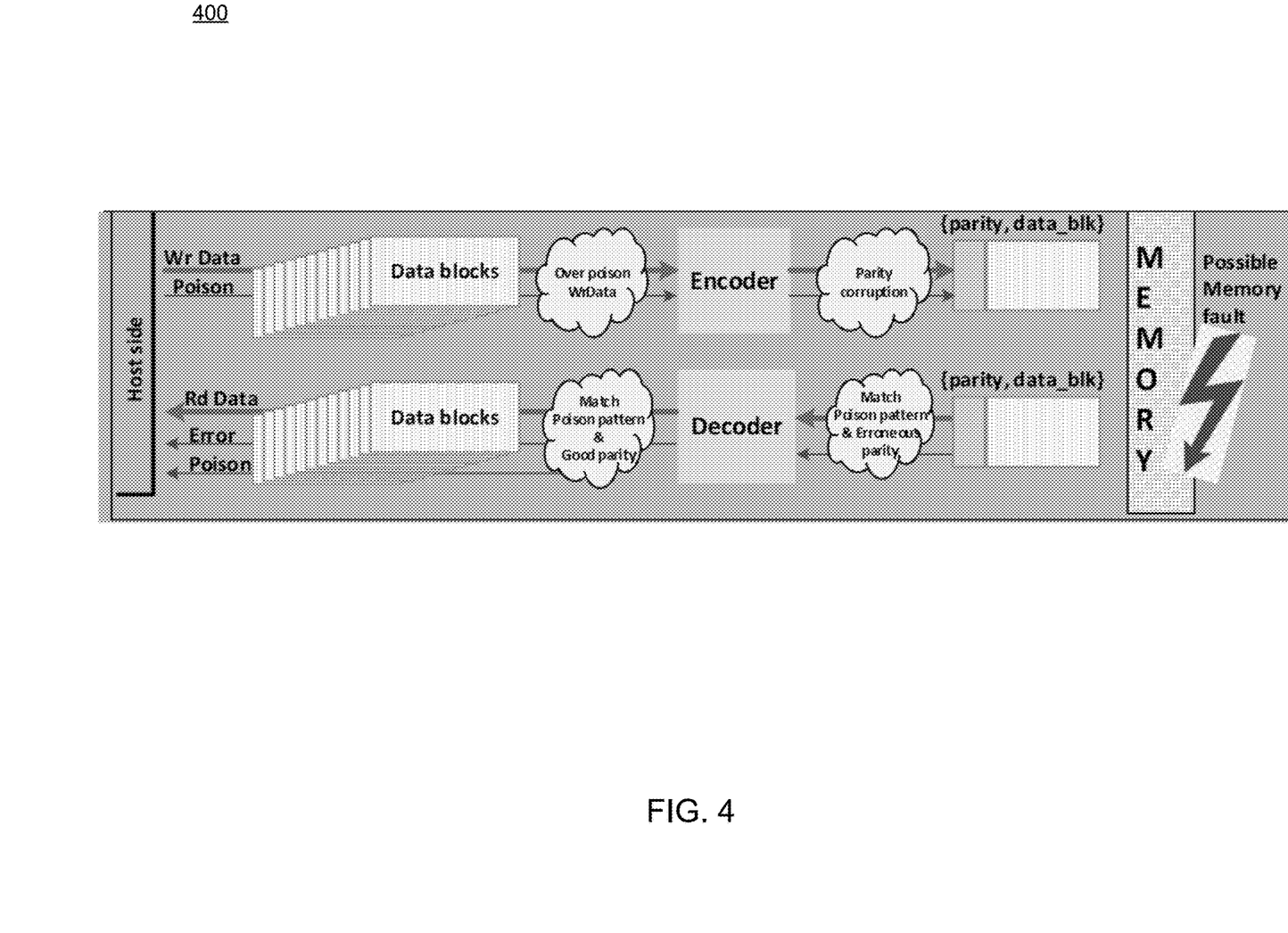
FIG. 4 illustrates a memory controller sub-system consistent with embodiments of the present disclosure

Referring now to FIG. 4, a diagram showing a memory controller sub-system 400 consistent with embodiments of the present disclosure is provided. Memory controller sub-system 400 provides a mechanism for poison information propagation, in storage devices where spare storage is not available. Embodiments included herein may be able to differentiate between error due to memory fault and error due to poisoned write data. As used herein, the phrases "corrupted data" and "poisoned data" may be used interchangeably and a "poison pattern" may refer to a known prefixed pattern. Using the poison propagation mechanism shown in FIG. 4, it is possible to safely differentiate, for a failed parity check, between an actual memory fault and poisoned write data. Error reporting to the host device should be unique in both error cases as it is helpful for the host to know the source of the erroneous read data.

A pre-fixed pattern could be any known data-pattern and may include a pattern that may be used to compare and match during the read. One example of a known pattern for a 64 bit data-word ECC can be 64'hDEAD_BEEF_DEAD_BEEF or 64'h555_5555_555_5555 or 64'hCADE_110E_CADE_110E. The erroneous write data may be replaced with this pattern and hence the new data to be written to memory is this known pattern. Also, it should be noted that if there is an error in only part (or even a single bit) of the write data the entire 64 bit data may be replaced (referred to herein as "overpoisoning") as there is 64 bit ECC data-word granularity in this example.

Embodiments of the present disclosure provide a mechanism to propagate poisoned write data information in the read path and provide numerous advantages over existing approaches. In contrast to existing approaches, no spare storage is required to store the poison information. Additionally and/or alternatively, during the read, embodiments included herein may differentiate between any parity error due to originally poisoned data and an actual memory fault.

In some embodiments, and referring again to FIG. 4, the process may include a multi-part process to strengthen the read-error differentiation check. The process may include over-poisoning the write data, converting to a known data pattern, and matching during the read. The overpoisoning may spread across all data bits that are part of one ECC data word. Here, the ECC data word may correspond to the number of bits of data processed by the ECC encoder/decoder (e.g., 64b, 128b, 256b, etc.).

In some embodiments, the process may further include injecting a correctable error in the parity code. This may then be corrected during the read operation, data patterns and parity code matched. Accordingly, this mechanism may convert poisoned write-data into known data, namely a poison pattern, which may be written into the memory. It should be noted that input data is generally already corrupted so over poisoning (changing the data with a known pattern) the same should not make any difference to the host device when the same is read back as the data may be reported erroneous and becomes unusable. During the read transaction the read-data may be matched against the known poison-pattern and if there is a match, the first level check is passed. If the actual data is not poisoned, but matches the poison pattern there is a possibility of a false detection during the read operation. To avoid such false detection, embodiments included herein may be configured to inject a correctable error in the parity code at specific bit/bits that may be written along with poisoned write data. During the read operation, the data should match the poison pattern and corrupted parity code. After correction, the expected poison pattern and parity match. This provides a second level check. This approach relies on an analysis of the write data matching the poison-pattern, before the error (that was intentionally injected in parity code) correction and after the error correction. In this way, embodiments included herein provide a multi-level check structure that can help predict that any false detection has been avoided.

It should be noted that embodiments included herein may be applied to any memory storage solution with ECC and any codec type. In some embodiments, multi-bit correction ECC may provide an even better second level check as there may be intentional parity corruption of multiple bits that may be corrected during the read operation this provides more robust second level checks.

Figure 5:
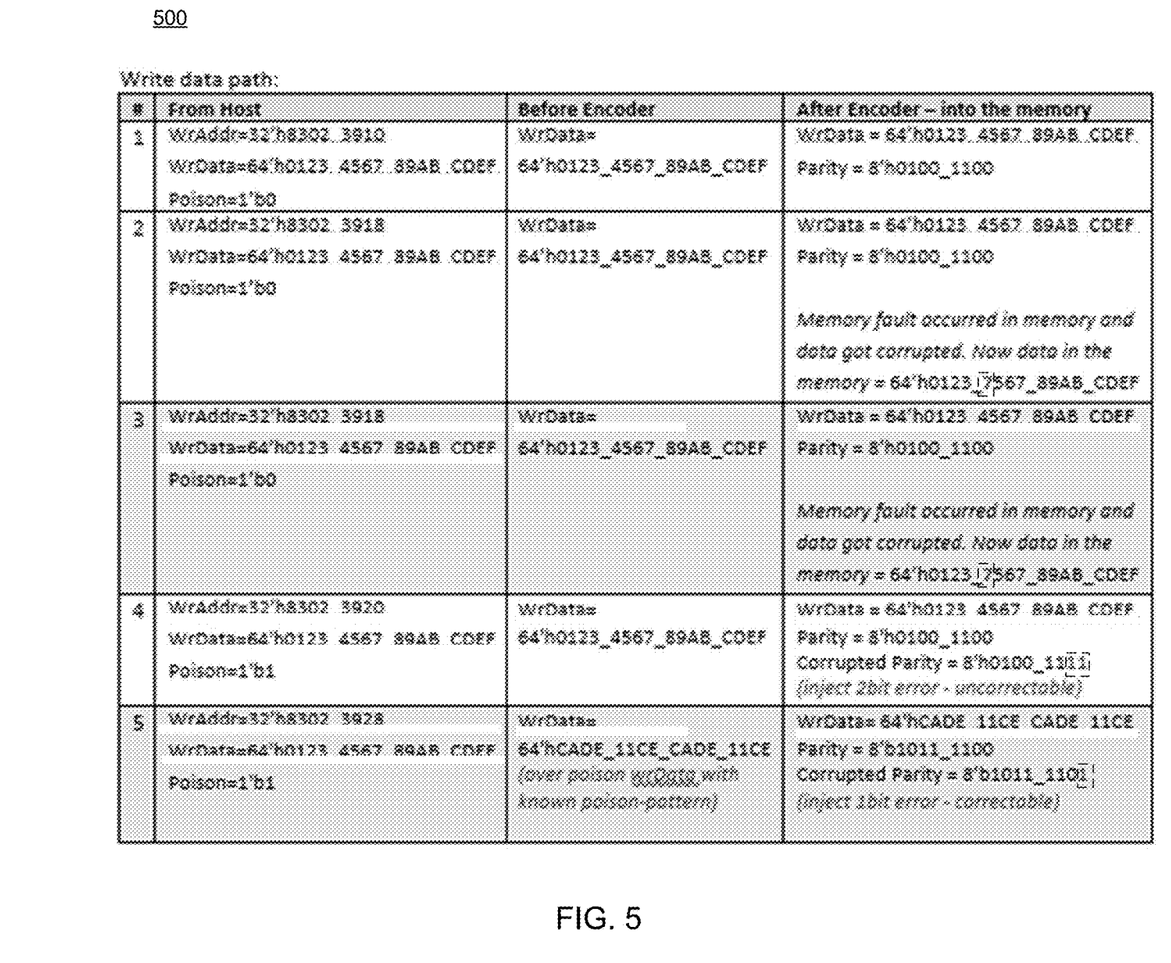
FIG. 5 illustrates a write data path example consistent with embodiments of the present disclosure.
Figure 6:
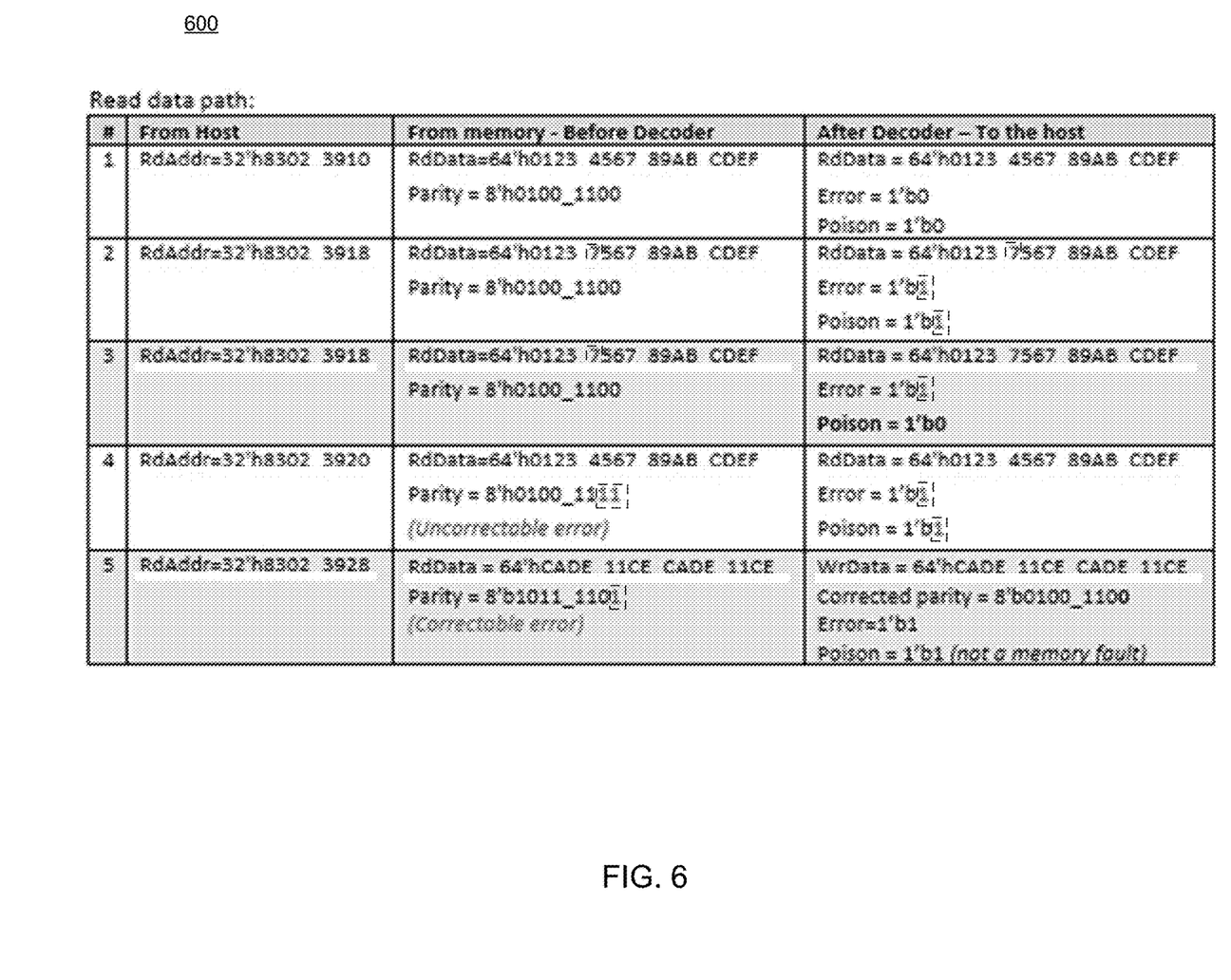
FIG. 6 illustrates a read data path example consistent with embodiments of the present disclosure.

Referring also to FIGS. 5-6, embodiments showing examples for both the write data path and the read data path are provided. For both FIG. 5 (write path) and FIG. 6 (read path response) each row is numbered with a case number. Also, correction is required as Parity=8'h* should be Parity=8'b*. This is case number 1. For a normal case when poison=0, nothing need be done and the data may be written to memory. Case number 2 shows an error case where poison=0 but a memory fault occurred (indicated by originally value 4 changed to 7 due to corruption). In existing mechanisms, the only way to propagate this poisoned data is by making the data uncorrectable by injecting uncorrectable error in parity codes. During the read, the response is Error=1 and poison=1. Here, even though there was no poisoned write it may be necessary to indicate the read data as poisoned and erroneous. This is because when uncorrectable erroneous data is received, it may not be possible to differentiate if the error is due to poisoned write or due to actual memory fault. Case number 3 shows a mechanism where the memory fault specific error is reported as an error only and the poison flag response is '0'. This is because we deploy mechanism of write data over-poison and pattern matching to differentiate between memory fault and poisonedWr. Case number 4 shows a poisoned write data error case where write path poisoned flag=1. This poison information must be propagated to host during read of this data to make sure host discards the data. In existing mechanisms the only way to propagate the poison is by injecting uncorrectable error (by parity code error injection 8'b0100_1100 changed to 8'b0100_1111) but during read the response is error=1 and poison=1 same as what we saw in memory fault case . . . so no differentiation between poison error or memory error. In the applications where it is critical to know the source of error, Cadence mechanism helps. Case number 5 shows a mechanism where an overpoisoning of the poisoned write data is performed (by replacing 64'h0123_4567_89AB_CDEF with 64'hCADE_110E_CADE_110E) and injecting correctable parity error (8'b0100_1100 changed to 8'b0100_1101) for second-level check during the read. During the read the process may compare the read data and parity code with pattern and parity code before the error correction and after the error correction. If checks are true, we indicate only poison=1 and error=0.

In the write path, the process may include receiving write data with a poison flag asserted indicating the data to be written to memory is erroneous. The write data may be encrypted cipher data, the encryption may occur before the over-poisoning and ECC and the decryption happens after the ECC and pattern checks. An ECC encoder may be configured to generate a parity code. Here, a correctable error may be injected in the data and/or the parity code. This provides a new known data pattern and parity code. The data and parity code may then be written into the memory.

In the read path, the process may include comparing the read data and the parity code with a new known data pattern and parity code. An ECC decoder may be configured to correct the intentionally injected correctable error. After correction, the process may compare the pre-fixed known data pattern and parity code. If the compare checks pass, the process may report the error as poison propagated.

Figure 7:
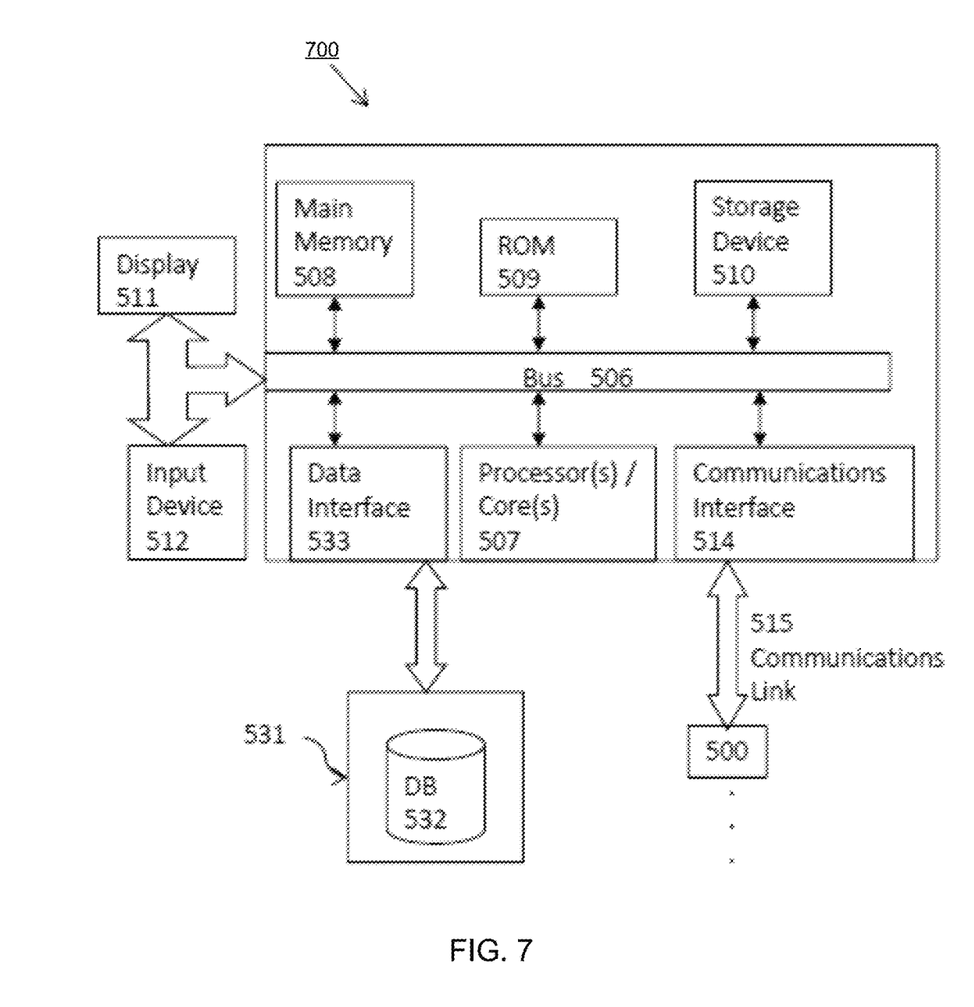
FIG. 7 illustrates a system diagram that may be used to implement one or more embodiments.

In some embodiments, encryption and decryption may be performed using any encryption method that generates cipher data of the same size. The encoder and decoder may utilize any encoder and decoder that generates a parity code and is capable of correcting 1bit or multibit errors. The result of the data pattern and parity code comparison allows for differentiating error due to memory fault and error due to poisoned write data. Data being written to memory may already be corrupted and when this data is read from the memory, it may be reported as poisoned data, thereby propagating poison information, when there is no storage in the memory for poison information. Poison information may be propagated with over poisoning of the write data by converting it to known data pattern, injecting correctable error in the parity code or write data. During the read the process may match the read data and pattern with the expected data pattern and parity code before and after the error correction FIG. 7 illustrates a block diagram of an illustrative computing system 700 suitable for poison information propagation as described in the preceding paragraphs with reference to various figures. Computer system 700 includes a bus 506 or other communication mechanism for communicating information, which interconnects subsystems and devices, such as processor 507, system memory 508 (e.g., RAM), static storage device 509 (e.g., ROM), disk drive 510 (e.g., magnetic or optical), communication interface 514 (e.g., modem or Ethernet card), display 511 (e.g., CRT or LCD), input device 512 (e.g., keyboard), and cursor control (not shown).

According to one embodiment, computing system 700 performs specific operations by one or more processor or processor cores 507 executing one or more sequences of one or more instructions contained in system memory 508. Such instructions may be read into system memory 508 from another computer readable/usable storage medium, such as static storage device 509 or disk drive 510. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 507, where the one or more processors, one or more processor cores, or combination thereof executes one or more threads. For example, various acts of identifying, various acts of determining, various acts of classifying, various acts of implementing, various acts of performing, various acts of transforming, various acts of decomposing, various acts of updating, various acts of presenting, various acts of modifying, etc. may be performed by one or more processors, one or more processor cores, or combination thereof.

A mechanism described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a mechanism described herein may be implemented as an application-specific integrated circuit (ASIC) in some embodiments.

In these embodiments, a mechanism may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of mechanism. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any non-transitory medium that participates in providing instructions to processor 507 for execution. Such a medium may take many forms, including but not limited to, non-volatile media and volatile media. Non-volatile media includes, for example, optical or magnetic disks, such as disk drive 510. Volatile media includes dynamic memory, such as system memory 508. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 515 (e.g., LAN, PTSN, or wireless network) may perform the sequence of instructions required to practice the invention in coordination with one another.

Computer system 700 may transmit and receive messages, data, and instructions, including program, e.g., application code, through communication link 515 and communication interface 514. Received program code may be executed by processor 507 as it is received, and/or stored in disk drive 510, or other non-volatile storage for later execution. In an embodiment, the computing system 700 operates in conjunction with a data storage system 531, e.g., a data storage system 531 that includes a database 532 that is readily accessible by the computing system 700. The computing system 700 communicates with the data storage system 531 through a data interface 533. A data interface 533, which is coupled with the bus 506, transmits and receives electrical, electromagnetic or optical signals that include data streams representing various types of signal information, e.g., instructions, messages and data. In embodiments of the invention, the functions of the data interface 533 may be performed by the communication interface 514. It also should be appreciated that the computer system 700 may be extended to a cloud-based computing system.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A method of propagating poison information comprising:
    receiving write data having a poison flag asserted indicating the data to be written to a memory device is erroneous;
    converting the write data to a pre-fixed data pattern;
    generating a parity code, based upon, at least in part, the pre-fixed data pattern;
    injecting a correctable error into converted write data or parity code; and
    writing the converted write data and parity code into the memory device.

2. The method of claim 1, further comprising:
attempting to read data from the memory device.

3. The method of claim 2, wherein attempting to read data from the memory device includes comparing the read data and parity code with a new known data pattern and parity code.

4. The method of claim 3, wherein attempting to read data from the memory device includes correcting the correctable error at a decoder.

5. The method of claim 4, further comprising:
comparing an output of the decoder with the pre-fixed data pattern.

6. The method of claim 5, further comprising:
reporting an error as poison propagated based upon the comparing.

7. A method of propagating poison information comprising:
receiving write data having a poison flag asserted indicating the data to be written to a memory device is erroneous;
converting the write data to a data pattern;
generating a parity code, based upon, at least in part, the data pattern;
injecting a correctable error into converted write data or parity code;
writing the converted write data and parity code into the memory device; and
attempting to read data from the memory device, wherein attempting to read data from the memory device includes comparing the read data and parity code with a new known data pattern and parity code before and after any erroneous parity correction.

8. The method of claim 7, wherein attempting to read data from the memory device includes correcting the correctable error at a decoder.

9. The method of claim 8, further comprising:
comparing an output of the decoder with the data pattern.

10. The method of claim 9, further comprising:
reporting an error as poison propagated based upon the comparing.

11. A system comprising:
a processor configured to transmit write data having a poison flag asserted indicating the data to be written to a memory device is erroneous, the at least one processor further configured to convert the write data to a pre-fixed data pattern and to generate a parity code, based upon, at least in part, the pre-fixed data pattern, the at least one processor further configured to inject a correctable error into converted write data or parity code and to write the converted write data and parity code into the memory device.

12. The system of claim 11, further comprising:
attempting to read data from the memory device.

13. The system of claim 12, wherein attempting to read data from the memory device includes comparing the read data and parity code with a new known data pattern and parity code.

14. The system of claim 12, wherein attempting to read data from the memory device includes correcting the correctable error at a decoder.

15. The system of claim 14, further comprising:
comparing an output of the decoder with the pre-fixed data pattern.

16. The system of claim 15, further comprising:
reporting an error as poison propagated based upon the comparing.

17. The system of claim 14, wherein the decoder is configured to correct one bit or multi-bit errors.

* * * * *